United States Patent [19]

Riley, Jr.

[11] 4,272,729
[45] Jun. 9, 1981

[54] AUTOMATIC PRETUNING OF A VOLTAGE CONTROLLED OSCILLATOR IN A FREQUENCY SYNTHESIZER USING SUCCESSIVE APPROXIMATION

[75] Inventor: William J. Riley, Jr., Pittsford, N.Y.

[73] Assignee: Harris Corporation, Melbourne, Fla.

[21] Appl. No.: 37,886

[22] Filed: May 10, 1979

[51] Int. Cl.³ .............................................. H03L 7/12
[52] U.S. Cl. .................................... 331/1 A; 331/4; 331/11; 331/25
[58] Field of Search ...................... 331/1 A, 4, 10, 11, 331/14, 17, 18, 25

[56] References Cited

U.S. PATENT DOCUMENTS

| | | | |
|---|---|---|---|
| 3,401,353 | 9/1968 | Hughes | 331/25 X |
| 3,825,855 | 7/1974 | Basset et al. | 331/11 X |
| 4,103,250 | 7/1978 | Jackson | 331/1 A |
| 4,105,948 | 8/1978 | Wolkstein | 331/14 |
| 4,107,623 | 8/1978 | Graf et al. | 331/11 X |

*Primary Examiner*—Siegfried H. Grimm
*Assistant Examiner*—Edward P. Westin
*Attorney, Agent, or Firm*—L. Lawton Rogers, III

[57] ABSTRACT

The automatic pretuning of a voltage controlled oscillator in a phase locked loop frequency synthesizer utilizes a successive approximation technique to rapidly bring the coarse tuning voltage of the oscillator to the desired pretuning value. A digital number stored in a digital register is converted to an analog voltage value and applied to the voltage controlled oscillator as the coarse tuning voltage. The frequency of the output signal from the oscillator is compared with a reference signal, and control logic responsive to the sense of the frequency difference between the reference signal and the oscillator output signal adjusts the value of the number stored in the digital register successively from the most significant bit to the least significant bit. A microprocessor can be used to adjust the value of the number stored in the register, as well as provide additional functions such as reverse successive approximation when the synthesizer is switched from one frequency to another frequency. The microprocessor can also be used to sweep the coarse tuning voltage of the oscillator until the output signal is within the capture range of the phase locked loop, and thereafter perform a successive approximation function to bring the coarse tuning voltage to the center of the capture range.

17 Claims, 6 Drawing Figures

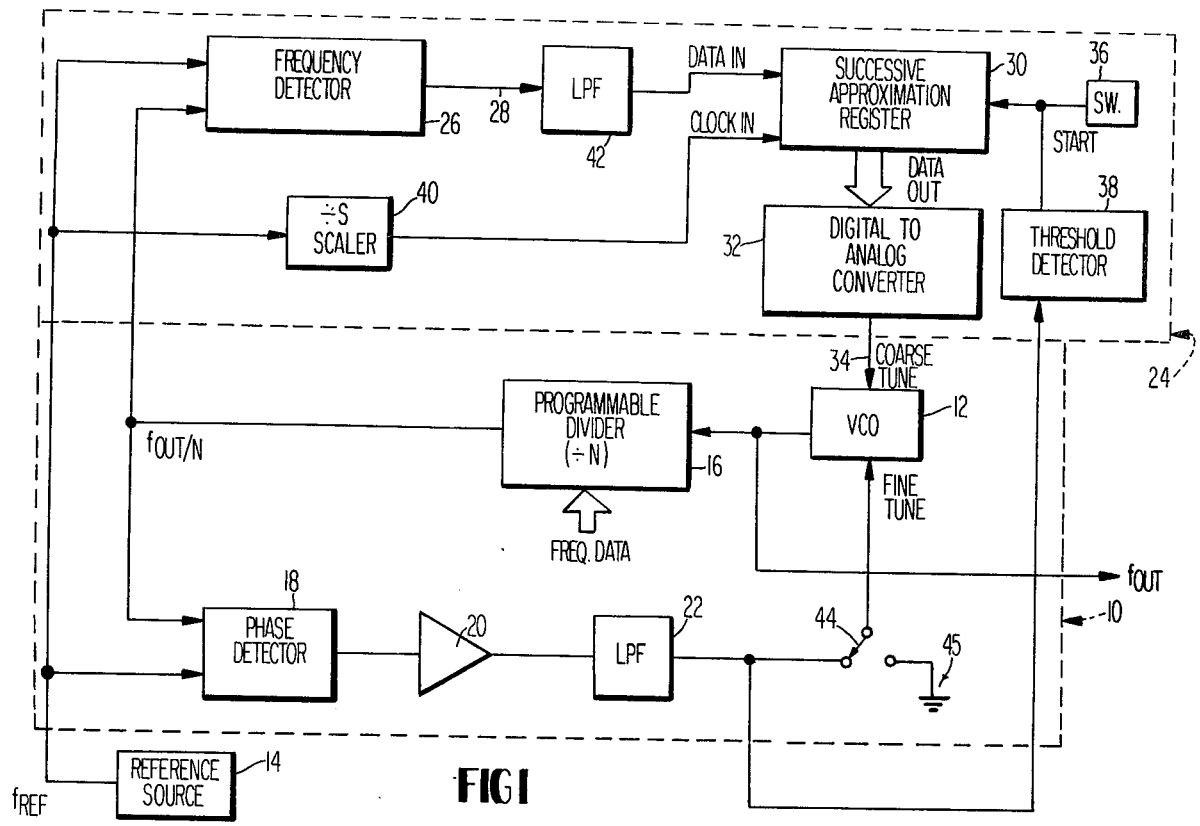
FIG 1
FIG 2
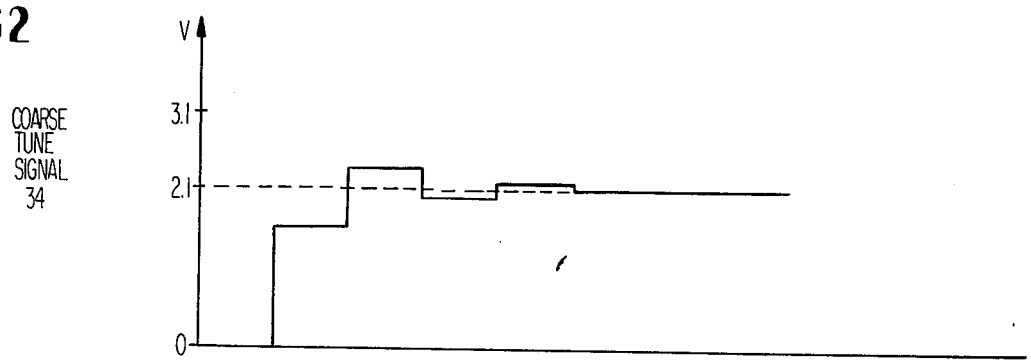
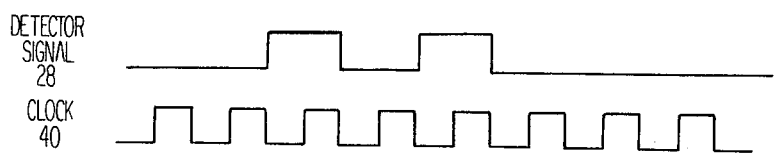

AUTOMATIC PRETUNING OF A VOLTAGE CONTROLLED OSCILLATOR IN A FREQUENCY SYNTHESIZER USING SUCCESSIVE APPROXIMATION

BACKGROUND OF THE INVENTION

The present invention relates to frequency synthesizers, and more particularly to frequency synthesizers which utilize a phase locked loop having a voltage controlled oscillator that must be coarse- or pre-tuned in order to bring the output signal of the oscillator within the capture or lock-up range of the phase locked loop.

Frequency synthesizers using phase locked loops with voltage controlled oscillators are well known. The phase locked loop basically comprises a feedback circuit for producing a fine tune control signal which is applied to the voltage controlled oscillator and operates to bring the output signal of the oscillator into phase lock with a reference signal. Due to the properties of the components which make up the phase locked loop, the loop has an inherent capture range wherein the output signal from the voltage controlled oscillator must be within a predetermined range of frequencies from the reference signal before the loop can operate to bring the oscillator signal into phase lock with the reference signal. When the tuning range of the voltage controlled oscillator is greater than the capture range of the phase locked loop, it is a frequent requirement that the voltage controlled oscillator be coarse- or pre-tuned to bring the frequency of its output signal within the capture range of the phase locked loop so that the system will be able to acquire phase lock. This requirement becomes more stringent as the ratio of the oscillator tuning range to the loop capture range increases.

Previous methods for pretuning the voltage controlled oscillator in a frequency synthesizer have generally involved the generation of a coarse tuning voltage as a fixed function of the desired output frequency. The value of the coarse tuning voltage is predetermined for each desired output frequency. Difficulties have arisen in the use of these prior art methods because misalignment of the oscillator, aging of components, oscillator drift and temperature effects can often result in the need to coarse tune the oscillator with a voltage signal which is different from the predetermined signal for a given output frequency. A predetermined fixed tuning voltage cannot adapt to the changing conditions brought about by these factors, and therefore requires periodic adjustment.

In addition, the characteristics of frequency synthesizers and voltage controlled oscillators vary from one synthesizer to the next. This factor requires that the predetermined tuning voltages be established individually for each synthesizer during production, thus increasing the cost and time of manufacturing. This problem is further compounded when the tuning characteristics of the oscillator are non-linear, unpredictable or inconsistent.

Therefore, it is an object of the present invention to provide a novel method and apparatus for pretuning a voltage controlled oscillator in a phase locked loop frequency synthesizer which overcomes the problems associated with the use of a fixed pretuning voltage generated as a function of the desired output frequency.

It is another object of the present invention to provide a novel method and apparatus for pretuning a voltage controlled oscillator which is automatic and adapts to the changing conditions brought about by misalignment of the oscillator, aging of components, oscillator drift, the effect of temperature on the various circuit components as well as the inherent differences found from synthesizer to synthesizer.

It is a further object of the present invention to provide a novel method and apparatus for automatically pretuning a voltage controlled oscillator in a variety of different types of frequency synthesizers having different tuning characteristics.

Another prior art technique for pretuning a voltage controlled oscillator utilizes a step or staircase voltage signal as the coarse tuning signal. The staircase signal is applied as a control signal to the voltage controlled oscillator until the output signal from the oscillator is within the capture range of the phase locked loop. U.S. Pat. No. 3,825,855, issued to Basset et al, discloses a frequency synthesizer which is exemplary of this prior art.

One problem associated with the use of a staircase coarse tuning signal is the amount of time that is required to pretune the voltage controlled oscillator to the proper value. Since the coarse tuning voltage is varied by only an incremental voltage value during each clock period of the pretuning operation, a substantial amount of time may be required to bring the oscillator output signal to the proper frequency, particularly if the proper pretuning signal is at or near one end of the oscillator tuning range. The time involved becomes an important factor when rapid frequency changes are required, for example, when shifting a transceiver from the transmitting to the receiving mode of operation.

It is therefore another object of the present invention to provide a novel method and apparatus for automatically adaptively pretuning a voltage controlled oscillator which avoids the time constraints involved with the use of a staircase coarse tuning signal.

It is yet a further object of the present invention to provide a novel method and apparatus for pretuning the voltage controlled oscillator in a frequency synthesizer which is capable of changing the output signal of the voltage controlled oscillator from a first frequency to a second frequency in a relatively short period of time.

These and other objects and advantages of the present invention will become apparent to one of ordinary skill in the art to which the present invention pertains upon a perusal of the following description when taken in conjunction with the accompanying drawings.

BRIEF DESCRIPTION OF THE DRAWINGS

FIG. 1 is a schematic block diagram of a frequency synthesizer having a phase locked loop and a coarse tuning control circuit;

FIG. 2 is a graph illustrating the relationship of the output signals from the successive approximation register, frequency detector and scaler clock;

DETAILED DESCRIPTION OF THE PREFERRED EMBODIMENTS

Figure 3:
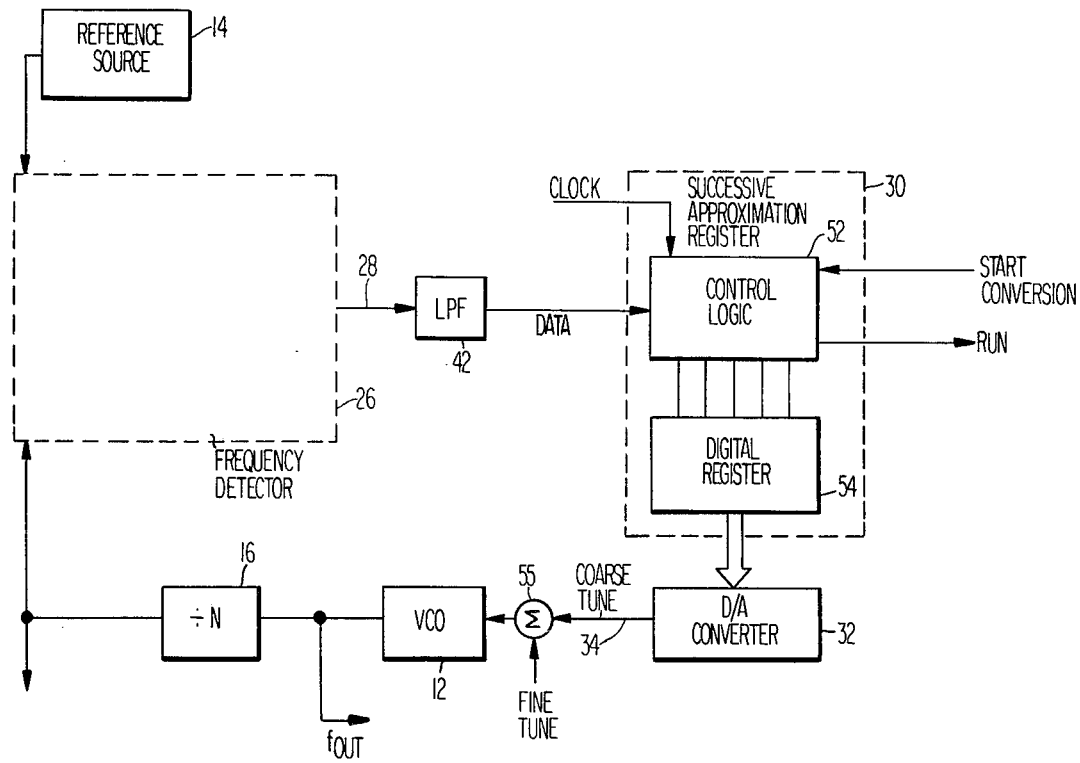
FIG. 3 is a more detailed schematic block diagram of an embodiment of a coarse tuning control circuit.

The present invention relates to an improved method and apparatus for pretuning the voltage controlled oscillator in a phase locked loop frequency synthesizer. The pretuning system of the present invention automatically coarse tunes the voltage controlled oscillator as a function of the desired output frequency, and adapts to changing conditions so that the voltage controlled oscillator is always brought within the capture range of the phase locked loop. Phase lockup is thus insured even when factors such as misalignment of the oscillator, aging of components, oscillator drift, temperature and other effects are present that could otherwise cause lockup failure in a system using a fixed predetermined pretuning voltage.

The basic elements of a phase locked loop frequency synthesizer 10 which can be used with the present invention are illustrated in block diagram form in FIG. 1. While this block diagram will be used as an example of the automatic pretuning process, it may be applied to many other synthesizer configurations. A voltage controlled oscillator (VCO) 12 provides an output signal having a frequency which is a function of the voltage level of an input signal fed to the oscillator. The output signal of the voltage controlled oscillator 12 is utilized as the output signal of the frequency synthesizer 10.

A reference signal is provided to the frequency synthesizer 10 by a reference source 14. The frequency of the reference signal from the reference source 14 determines the size of the frequency increments by which the output signal from the frequency synthesizer 10 can be increased or decreased. The output signal from the reference source 14 is preferably a highly stable signal having a frequency which does not vary over time or changing environmental conditions, such as temperature, etc. A quartz crystal oscillator can be used to provide such a stable reference signal.

The output signal from the voltage controlled oscillator 12, in addition to providing the output signal for the frequency synthesizer 10, is supplied to an input terminal of a programmable frequency divider 16. The programmable divider 16 is programmed to divide the frequency of the output signal from voltage controlled oscillator 12 by an integer N. The integer N is determined from the relationship of the desired output signal from the frequency synthesizer 10 to the frequency of the reference signal, wherein:

$$f_{OUT} = N \cdot f_{REF}.$$

A change in the frequency of the output signal from the synthesizer 10 is made by changing the value of the divisor factor N.

The output signal from the programmable divider 16 is compared with the reference signal in a phase detector 18. The phase detector 18 compares the phase of the divided output signal with that of the reference signal, and produces an analog voltage signal proportional to the phase difference between the two compared signals. This output signal can be amplified in an amplifier 20, and is passed to a low pass filter, or loop filter, 22. The output signal from the loop filter 22 is presented to a control input terminal of the voltage controlled oscillator 12, to control the frequency of the output signal from the oscillator.

In the operation of the frequency synthesizer 10, the frequency of the output signal from the voltage controlled oscillator 12 is divided by the programmed divisor factor N. The frequency of this divided output signal is compared with that of the stable reference signal. An analog voltage signal representative of the phase difference between the two compared signals is presented to the loop filter, wherein it is integrated, and this integrated signal is fed to the voltage controlled oscillator as a fine tuning signal which operates to lock the phase and frequency of the output signal from the voltage controlled oscillator to those of the reference signal.

The ability of the frequency synthesizer 10 to lock the output signal of the voltage controlled oscillator onto the reference signal is limited by the capture range of the frequency synthesizer. In order to achieve the desired lockup, the initial frequency of the output signal from voltage controlled oscillator 12 must be within the capture range of the frequency synthesizer 10, i.e., the difference in frequency between the divided output signal of the voltage controlled oscillator and the reference signal must be less than a limit value which is inherent to the frequency synthesizer 10. This limit value, and hence the capture range of the frequency synthesizer, is a function of the bandwidth of the phase locked loop. Among other factors, the frequency response characteristics of the loop filter 22 determines the width of the capture range for the phase locked loop frequency synthesizer 10.

When the tuning range of the voltage controlled oscillator 12, i.e., the range of output frequencies which the oscillator 12 is capable of producing, is greater than the capture range of the phase locked loop, it is necessary to pretune the oscillator to bring the frequency of its output signal within the capture range of the loop. This is accomplished by applying a voltage signal to a control input terminal of the voltage controlled oscillator 12 which will cause the voltage controlled oscillator to produce an output signal at a frequency within the capture range of the loop. A coarse tuning circuit 24 for providing such a signal to the voltage controlled oscillator 12 is illustrated in FIG. 1.

The coarse tuning circuit 24 includes a frequency detector 26 which compares the frequencies of the reference signal and the output signal from the programmable divider 16. The frequency detector 26 produces a binary output signal on an output line 28, which signal is indicative of the sense of the frequency difference between the reference and divided oscillator output signals. For example, the output signal on the line 28 can be high when the frequency of the divided oscillator output signal is greater than the frequency of the reference signal, and can be low when the frequency of the divided output oscillator signal is less than or equal to the frequency of the reference signal.

The output signal from the frequency detector 26 is fed as a data signal to a successive approximation register 30. The unsuccessive approximation register 30 includes a digital register which stores a digital number. Depending on the sense of the frequency error of the divided oscillator output signal, i.e., whether the output signal from the frequency detector 26 is high or low, the successive approximation register 30 algebraically adds bit weightings to adjust the value of the digital number stored in its register successively from the most significant bit to the least significant bit. The number stored in the digital register of the successive approximation register 30 is fed to a digital to analog converter 32, wherein the digital number is converted to an analog voltage value. This analog voltage value is supplied along an output line 34 to the coarse tune control input terminal of the voltage controlled oscillator 12.

The operation of the successive approximation register to adjust the value of the digital number stored in its register can be initiated by means of a START command signal, which can be supplied by means of a switch 36, for example. Actuation of the switch 36 can be in response to a number of factors in the operation of the frequency synthesizer 10. For example, the switch 36 can be actuated when the frequency synthesizer 10 is initially actuated, to pretune the voltage controlled oscillator 12 upon the initial startup of the frequency synthesizer. In addition, the switch 36 can be actuated in response to detection of the fact that the phase-locked loop is in an unlocked state, and it also can be actuated whenever the frequency data which is programmed into the programmable divider 16 is changed to cause the frequency synthesizer 10 to switch its output signal from one frequency to another frequency. For example, if the frequency synthesizer 10 is incorporated in a transceiver, the switch 36 can be responsive to actuation of a push-to-talk switch which causes the output signal of the frequency synthesizer 10 to switch from a first frequency associated with a receiving mode of operation to a second frequency associated with a transmitting mode of operation.

In addition, a threshold detector circuit 38 can be incorporated in the coarse tuning circuit 24 to monitor the value of the fine tune signal produced by the loop filter 22. If the absolute value of the fine tune signal exceeds one of the two threshold values set in the threshold detector 38, the threshold detector will produce an output signal which will initiate the operation of the successive approximation register to adjust the value of the digital number stored therein. Thus, if the output signal from the voltage controlled oscillator 12 should begin to drift, the threshold detector will anticipate that the loop error signal is approaching the lock limit and will initiate operation of the successive approximation register and hence pretune the voltage controlled oscillator 12. This resets the pretune voltage to the voltage controlled oscillator to the center of the phase-locked loop and thus maintains the frequency synthesizer 10 in a lockup condition by preventing the fine tune control signal from reaching a limit value related to either end of the loop lock range. The threshold detector 38 can be controlled to initiate operation of the coarse tune circuit 24 at times when the overall system will not be upset.

The frequency of the output signal from the reference source 14 can be divided in a scaler 40 and the output signal from the scaler can be used to provide a clock signal for the operation of the successive approximation register 30.

If desired, a low pass filter 42 can be incorporated in the coarse tuning circuit 24 to integrate the binary output signal from the frequency detector 26 before it is fed as a data signal into the successive approximation register 30. However, it will be apparent to those of ordinary skill in the art that the low pass filter 42 is an optional feature and is not necessary for proper operation of the coarse tuning circuit 24.

During the pretuning operation, it is necessary to hold the fine tuning error voltage from the phase-locked loop at its nominal center value, to avoid spurious fine tuning fluctuations at the voltage controlled oscillator and to establish the normal operating point for the error voltage. This function can be accomplished by means of a switch 44 which, when actuated, connects the fine tune control input terminal of the voltage controlled oscillator 12 to a fixed voltage source 45 and disconnects the terminal from the loop filter 22. The fixed voltage source 45 is illustrated in FIG. 1 as being a ground reference potential, since such a potential may be midway between the extremes of the output error signal produced by the phase detector 18. However, it will be apparent to those of ordinary skill in the art that any suitable bias potential may be applied as the fixed fine tuning error signal during the pretuning operation.

The switch 44 can be actuated to switch the phase-locked loop error voltage to its nominal center value in response to production of the START command signal by the switch 36, for example. Thereafter, the switch 44 can reconnect the fine tune control input terminal of the voltage controlled oscillator 12 to the output terminal of the loop filter 22 when the successive approximation register 30 produces an output signal indicating that the successive approximation process has been completed.

The operation of the coarse tuning circuit 24 illustrated in FIG. 1 will now be explained with reference to the signal and timing graph of FIG. 2. For illustration purposes, it will be assumed that a five bit digital number is stored in the storage register of the successive approximation register 30. Furthermore, for the sake of convenience, it will be assumed that the coarse tuning voltage is variable between 0 and 3.1 volts, with a bit weight of 1 in the digital number corresponding to an increment in the coarse tuning voltage of 0.1 volt. For the present example, it will be assumed that the desired output signal of the frequency synthesizer 10 has a frequency corresponding to an input signal of 2.1 volts at the coarse tuning input terminal of the voltage controlled oscillator 12 when the fine tune voltage is at its center.

When the frequency synthesizer 10 is initially actuated, the coarse tuning control voltage can be at 0 volts, for example, and the switch 44 will be actuated to set the loop error signal at its nominal center value. The frequency of the output signal from the voltage controlled oscillator 12 will therefore be near the low end of its tuning range. The divided oscillator output signal coming from the programmable divider 16 will have a frequency less than that of the reference signal. Therefore, the output signal from the frequency detector 26 will be in its low state. This data will be fed to the successive approximation register 30, and on the first clock pulse after the production of a START command signal by the switch 36, the control logic in the successive approximation register 30 will add the most significant bit weight to the digital number stored therein. For a five bit digital number, the most significant bit weight is equal to 16, and therefore the value of the digital number in the successive approximation register 30 will go from 0 to 16. This number will be converted in the digital to analog converter 32 and produce a coarse tuning control signal of 1.6 volts. This event is shown occurring at the trailing edge of the first clock pulse in the timing diagram of FIG. 2.

After the most significant bit weight has been added to the digital number to cause a coarse tuning control signal of 1.6 volts to be produced, the frequency of the output signal from the voltage controlled oscillator 12 will increase, but the frequency of the divided oscillator output signal will still be less than the frequency of the reference signal. Therefore, the output signal from the frequency detector 26 will remain in its low state. At the second clock pulse, the control logic of the successive approximation register will cause the bit weight of the second most significant bit, i.e., 8, to be added to the digital number. This will cause the coarse tuning signal to jump from 1.6 to 2.4 volts, and produce a corresponding increase in the frequency of the output signal from the voltage controlled oscillator 12. At this point, the frequency of the divided oscillator output signal will be greater than the frequency of the reference signal, and therefore the output signal from the frequency detector 26 will go from a low state to a high state.

In response to this data, the successive approximation register will subtract the value of the next most significant bit, i.e., 4, from the digital number stored in its register. The value of the coarse tuning control signal will go from 2.4 to 2.0 volts and produce a corresponding decrease in the frequency of the output signal from the voltage controlled oscillator 12.

As a result of this decrease in the frequency of the output signal from the voltage controlled oscillator 12, the frequency of the divided oscillator output signal will again be less than the frequency of the reference signal, and the state of the output signal from the frequency detector 26 will go from high to low. In response to this data signal, the successive approximation register 30 will cause the bit weight of the next most significant bit, i.e. 2, to be added to the stored digital number, resulting in a coarse tuning control signal of 2.2 volts upon the production of the fourth clock pulse. This will result in a divided oscillator output signal having a frequency greater than the frequency of the reference signal, and therefore the successive approximation register will adjust the digital number by subtracting the weight of the least significant bit, i.e. 1, from the digital number. Thus, the coarse tuning control signal will have a value of 2.1 volts after the successive approximation process has been completed. The digital number will be stored in the register indefinitely, causing a constant coarse tuning signal to be produced until the next successive approximation procedure is initiated.

Once the successive approximation operation has been completed, the successive approximation register will produce an output signal to cause the fine tuning switch 44 to be actuated to connect the voltage controlled oscillator to the phase-locked loop. Thereafter, the frequency synthesizer 10 will operate in the normal manner to fine tune the voltage controlled oscillator 12 and maintain phase lockup with the reference signal. If the loop error voltage should exceed the threshold value set in the threshold detector 38, due to oscillator drift, for example, the detector will produce a START command signal to initiate operation of the successive approximation register 30 and reset the value of the coarse tuning signal in the manner described previously to adapt the synthesizer to the changing oscillator conditions. In addition, the control switch 36 can be actuated periodically or in response to detection of an unlocked condition.

From the foregoing, it can be seen that the coarse tuning circuit 24 illustrated in FIG. 1 operates to establish the proper coarse tuning control signal in a maximum number of clock periods equal to the number of bits in the stored digital number. Thus, in the present example, only five clock periods are required to establish the proper coarse tuning signal of 2.1 volts. This is to be contrasted with the prior art method in which a staircase coarse tuning signal having the same resolution of 0.1 volt would require 21 clock periods to establish a coarse tuning signal of 2.1 volts. For an eight bit digital number, the present invention would require a maximum of 8 clock periods whereas a staircase tuning procedure could require up to $2^8 = 256$ tuning steps. Thus, it can be seen that the present invention provides substantial savings in time over the prior art methods for automatically pretuning a voltage controlled oscillator in a frequency synthesizer.

A commercially available frequency detector which can be used to construct a coarse tuning control circuit such as that illustrated in FIG. 1 is a phase-frequency detector such as the CD4046. A commercially available successive approximation register such as the MC14559 may be used as the successive approximation register 30 in a hardware implementation of the coarse tuning control circuit illustrated in FIG. 1. The remaining components illustrated in FIG. 1 are well known per se, and commercially available embodiments of these components which are suitable for use in practicing the present invention will be apparent to those of ordinary skill in the art.

A more detailed block diagram of a preferred embodiment of the coarse tuning circuit of the present invention is illustrated in FIG. 3. Like reference numerals are used in FIG. 3 to illustrate components which correspond to those illustrated and previously described with regard to FIG. 1.

Referring now to FIG. 3, the frequency detector 26 receives as input signals the output signal from the reference source 14 and the divided oscillator output signal from the frequency divider 16. The frequency comparator 26 produces a binary output signal dependent upon the sense of the frequency difference between the two input signals. This binary output signal from the frequency comparator or detector 26, present on the line 28, can optionally be presented to a low pass filter 42 to integrate the signal and then presented as a data input signal to the successive approximation register 30.

The successive approximation register 30 basically comprises control logic 52 and the previously mentioned digital register 54. The control logic of the successive approximation register is responsive to the state of the output signal from the frequency detector 26 and operates to adjust the value of the digital number stored in the digital register 54 successively from the most significant bit to the least significant bit, as described previously with respect to the operation of the circuit of FIG. 1.

The voltage controlled oscillator 12 illustrated in FIG. 3 differs from that of FIG. 1 in that it only has a single control input terminal, rather than separate fine tune and coarse tune input terminals. In such a case, a suitable signal adder 55, such as a resistive adder or operational amplifier for example, can be used to combine the coarse and fine tune signals and present the combined signal to the input terminal of the oscillator 12. The adder can include appropriate circuitry for weighting the respective signals, if necessary.

While it is possible to utilize commercially available hardware as the successive approximation register, as noted previously, greater versatility can be obtained by utilizing a microprocessor to perform the functions of the control logic 52. The programming of the microprocessor to adjust the value of the digital number stored in the digital register 54 by a successive approximation technique will be apparent to those of ordinary skill in the art. In addition, the microprocessor can be programmed to carry out additional functions and thus provide greater flexibility to the coarse tuning circuit.

Among the additional functions which a microprocessor can provide to the coarse tuning circuit is a reverse successive approximation technique which can be used when switching the frequency synthesizer to or near a frequency for which a previous pretuning voltage is known. The operation of the coarse tuning circuit to perform such a function will be explained with reference to the timing and signal diagram of FIG. 4.

By way of example, let it be assumed that the frequency synthesizer is incorporated in a transceiver and that the transceiver is to be switched from a transmitting to a receiving mode of operation. In the transmitting mode of operation, the pretuning signal for the voltage controlled oscillator of the frequency synthesizer is set at 2.1 volts. Furthermore, it is known that the proper pretuning signal for the voltage controlled oscillator when it was previously in the receiving mode was 0.9 volt. To switch the frequency of the output signal from the frequency synthesizer, the divisor factor of the programmable divider 16 is switched from a first integer corresponding to the transmitting frequency to a second integer which corresponds to the receiving frequency which is for this example but not necessarily lower than the frequency of the local oscillator. When the programmable divider 16 begins to divide the frequency of the output signal from the voltage controlled oscillator 12 by the lower divisor factor, the frequency of the output signal from the divider 16 will be higher than that of the reference signal, and the output signal from the frequency detector 26 will go to the high state.

When the programmable divider 16 is programmed to divide the oscillator output signal by the divisor factor corresponding to the receiving frequency, the microprocessor forming the control logic 52 may be actuated by a START command signal to begin the reverse successive approximation technique. The microprocessor forming the control logic 52 will respond to the high level data signal by subtracting the bit weighting of the least significant bit, i.e. 1, from the digital number stored in the digital register 54. The control logic 52 will continue to subtract successively larger bit weightings from the digital number until the sense of the frequency difference between the divided oscillator output signal and the reference signal changes, causing the output signal from the frequency detector 26 to change states. This event is shown occuring after the fourth clock pulse in FIG. 4. Once the output signal from the frequency detector 26 changes states, the control logic 52 goes into a forward successive approximation technique beginning with the current bit, i.e., one bit less than the bit corresponding to the last bit weighting to be subtracted from the digital number. In this manner, the coarse tuning signal is brought to the proper value from a known starting point in a relatively rapid fashion.

Figure 4:
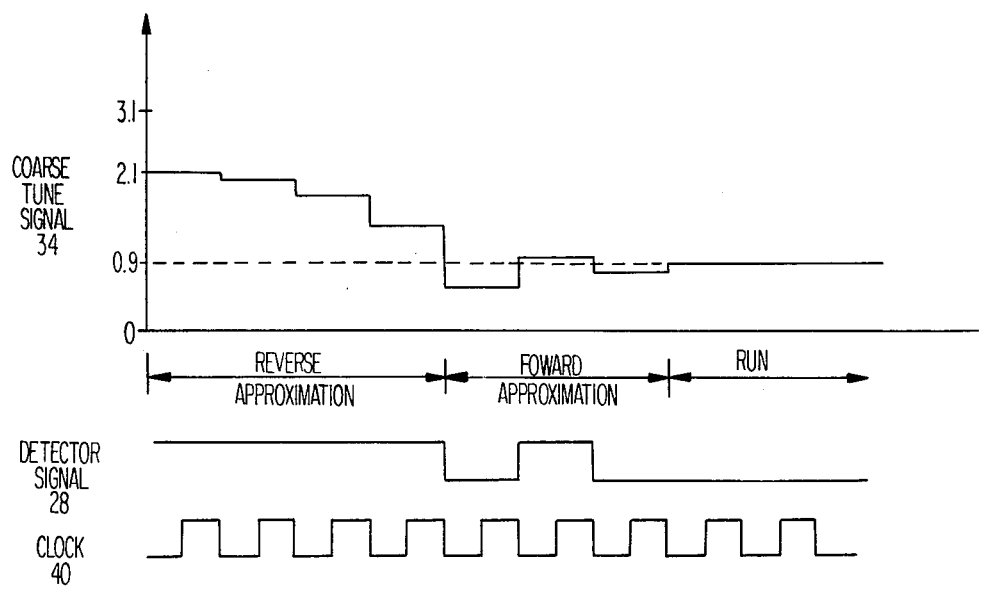
FIG. 4 is a graph illustrating the relationship of the output signals from the successive approximation register, frequency detector and clock when the voltage controlled oscillator is pretuned to change from a first output frequency to a second output frequency.

In the example illustrated in FIG. 4, bit weightings of 1, 2, 4 and 8 are successively subtracted from the digital number stored in the digital register 54, until the output signal from the frequency detector 26 changes states. The forward successive approximation technique then begins with a bit weight corresponding to one bit less than the last bit weight which was subtracted from the coarse tune signal. In the present example, the forward successive approximation procedure begins with a bit weighting of 4. In the forward successive approximation procedure illustrated in the example of FIG. 4, a bit weighting of 4 is added to the digital number, 2 is subtracted from the digital number and 1 is added to the digital number to bring the coarse tuning signal to the proper value of 0.9 volt. Once the forward successive approximation technique has been completed, the control logic 52 may produce a RUN signal indicating the voltage controlled oscillator 12 has been pretuned and the frequency synthesizer 10 can go into a normal mode of operation.

If the frequency synthesizer 10 is to be switched from a lower to a higher output frequency, the control logic 52 would operate to add successively larger bit weightings to the digital number in the reverse successive approximation procedure, until the output signal from the frequency detector 26 goes from a low to a high state. Thereafter, the control logic 52 would operate in normal forward successive approximation mode. Thus, during the reverse successive approximation procedure, the control logic 52 operates to algebraically add successively larger bit weightings to the stored digital number in dependence upon the sense of the frequency difference between the divided oscillator output signal and the reference signal.

By utilizing a microprocessor as the control logic 52, the availability of the reverse successive approximation procedure allows the voltage controlled oscillator to be pretuned from one output signal to a second output signal more rapidly in some instances than if only a forward successive approximation technique were to be used. It can be seen that it takes only seven clock periods to switch the pretuning signal from a value of 2.1 volts to 0.9 volts when using the reverse successive approximation technique. If the digital number stored in the digital register 54 has eight bits, for example, it would take eight clock periods to perform this same function using only the forward successive approximation technique, as illustrated with respect to FIG. 2. However, even this technique is much faster than the twelve clock periods it would require to go from the first to the second pretuning voltage if a staircase pretuning signal were to be used in the present example.

In addition to enabling rapid switching from one frequency to another, the reverse approximation technique can also be used to rapidly acquire phase lock if the synthesizer should go out of the lock condition.

Figure 5:
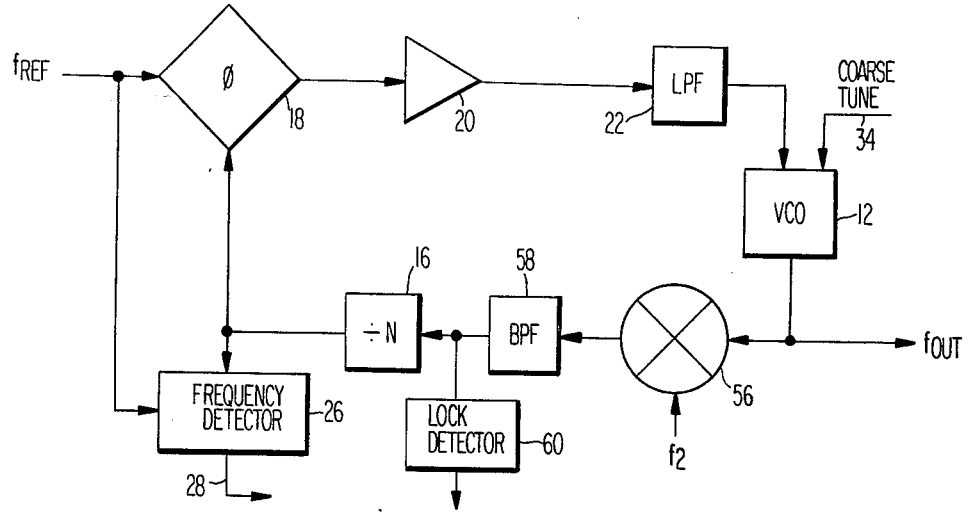
FIG. 5 is a schematic block diagram of a modified embodiment of a phase locked loop.

A microprocessor can also be programmed to provide additional functions which adapt the coarse tuning circuit to the particular requirements of the frequency synthesizer in which the tuning circuit is incorporated. For example, the phase-locked loop of the frequency synthesizer may contain a band pass filter having a relatively narrow bandwidth. A phase-locked loop of a heterodyne frequency synthesizer containing such a band pass filter is illustrated in FIG. 5. In addition to the components discussed previously with respect to FIG. 1, the heterodyne loop includes a mixer 56. The mixer combines the output signal of the voltage controlled oscillator 12 with a signal having a second frequency $f_2$, and produces an output signal having a frequency equal to the sum or difference of the frequencies of the two input signals. This resulting output signal is then passed through a band pass filter 58, and presented to the frequency divider 16.

If the voltage controlled oscillator 12 in such a loop is not properly pretuned, the output signal from the mixer 56 may have a frequency which is outside the pass band of the band pass filter 58. Therefore, the output signal from the band pass filter 58 will be negligible, and the frequency divider 16 will not provide a usable input signal to the frequency detector 26. With no input signal at one terminal of the frequency detector 26, the detector will either produce no output signal or will produce an output signal which is invalid for proper operation of the coarse tuning circuit. Since the output signal from the frequency detector is invalid or nonexistent, the coarse tuning circuit 24 will not be able to pretune the voltage controlled oscillator to bring the frequency of the oscillator output signal within capture range of the loop and hence bring the output signal from the mixer 56 within the pass band of the filter 58. Thus, the pretuning process cannot cover the entire tuning range of the voltage controlled oscillator. In such a case, the microprocessor forming the control logic 52 can be programmed to sweep the pretuning voltage through the tuning range of the voltage controlled oscillator 12 until the frequency detector 26 is capable of producing a valid output signal to enable the coarse tuning circuit to bring the pretuning voltage to the proper value. The operation of the microprocessor to perform this function is illustrated with respect to the signal and timing diagram of FIG. 6.

Figure 6:
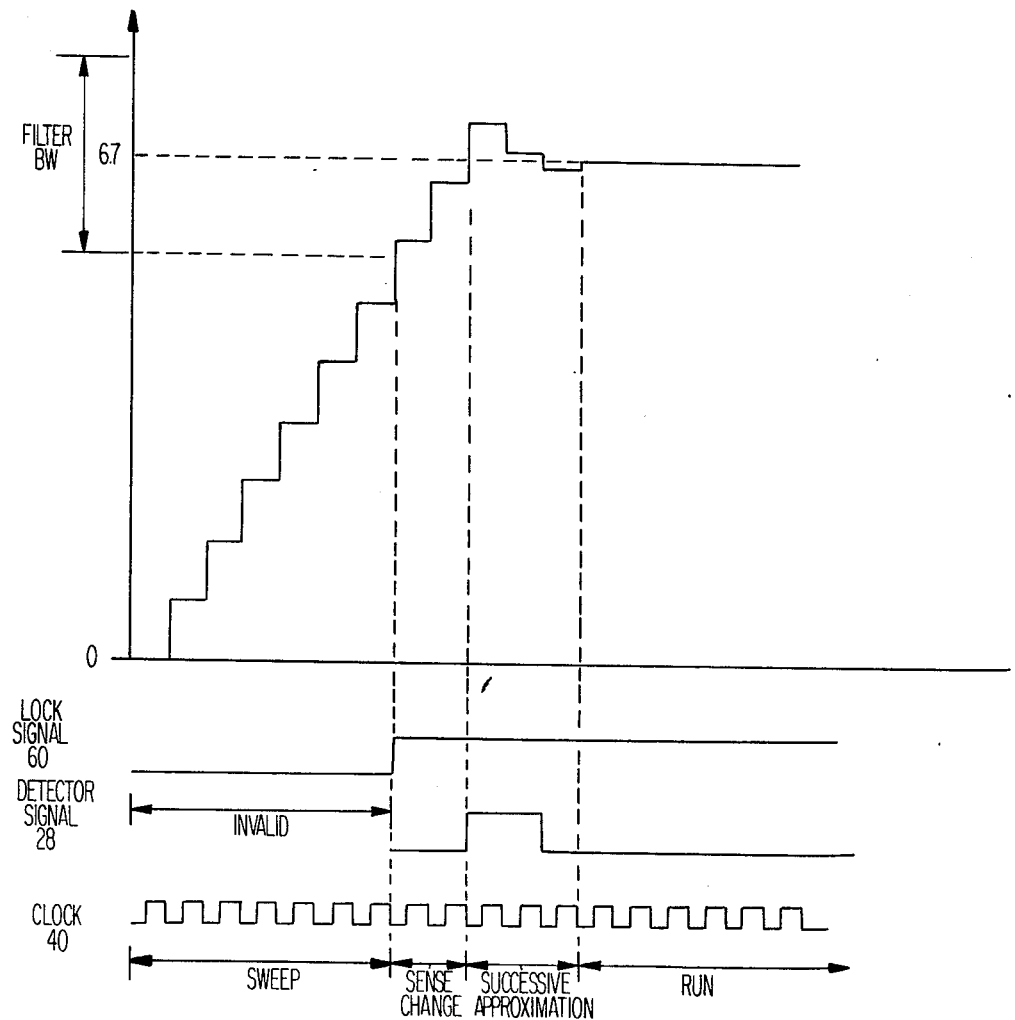
FIG. 6 is a graph illustrating the relationship of the output signals from the successive approximation register, unlock detector, frequency detector and clock when the voltage controlled oscillator is pretuned over a voltage range greater than the bandwidth of the phase locked loop of FIG. 5.

In the example illustrated with respect to FIG. 6, it assumed that the band pass filter 58 has a center frequency which corresponds to a signal of 6.7 volts at the coarse tuning input terminal of the voltage controlled oscillator 12. The digital number stored in the successive approximation register is assumed to be a four bit number. As illustrated, the bandwidth of the filter 58 is substantially less than the tuning range of the voltage controlled oscillator. Therefore, when the output signal from the voltage controlled oscillator 12, modified by the mixer 56, lies outside of the pass band of the filter 58, it is necessary to sweep the oscillator through its tuning range until the output signal from the mixer 56 comes within the pass band of the filter 58.

To perform this function, the microprocessor initially sets the coarse tuning voltage at one end of the tuning range of the voltage controlled oscillator. For example, the coarse tuning voltage can be set at 0 volts. Thereafter, the microprocessor sweeps the coarse tuning voltage through the tuning range of the voltage controlled oscillator until the output signal from the mixer 56 comes within the pass band of the band pass filter 58. This sweeping can be accomplished by incrementing the coarse tuning signal by an amount corresponding to the largest bit weighting of the digital number stored in the digital register 54. However, the size of the voltage steps used during the sweeping operation should be less than an amount corresponding to the bandwidth of the band pass filter 58, to avoid a situation in which the coarse tuning signal might pass through the capture range of the phase-locked loop in a single sweeping step.

As long as the output signal from the mixer 56 is outside of the pass band of the filter 58, the output signal from the frequency detector 26 will be invalid and the successive approximation register 30 will not be provided with a data signal which will enable it to perform the coarse tuning operation. Therefore, it is preferable to provide a lock detector circuit 60 in the frequency synthesizer which will indicate when the output signal from the voltage controlled oscillator 12 has come within the capture range of the loop.

Such a lock detector 60 may be a threshold detector, for example, which is responsive to the output signal from the band pass filter 58 and provides a high level output signal when the signal from the band pass filter 58 exceeds a predetermined threshold level. If the output signal from the band pass filter 58 exceeds the threshold level, the lock detector 60 will provide a signal to indicate that the output signal from the voltage controlled oscillator 12 is within the capture range of the loop. This output signal from the lock detector 60 also indicates that the output signal from the frequency detector 28 is now valid. A better lock detector arrangement is one that is included in the logic of the phase detector which actually indicates a locked condition of the loop. This kind of lock detector can detect "cycle slipping" between the phase detector input signals. Another way is to detect unlock as an a.c. "beat note" on the VCO control voltage.

In the example illustrated in FIG. 6, the microprocessor increases the coarse tuning signal incrementally for seven clock periods until the lock detector 60 produces a high level signal indicating that the output signal from the mixer 56 is within the pass band of the filter 58. At this point, the microprocessor could discontinue the sweeping operation, since the successive approximation register is now provided with a valid data signal from the frequency detector 28. However, it is preferable to continue the sweeping operation until the frequency detector 26 indicates a change in the sense of the frequency error between the reference signal and the oscillator output signal. By continuing the sweeping operation until a sense change is detected, the coarse tuning signal will be closer to the final pretuning voltage when the successive approximation technique begins. This establishes the required bit weighting at which to begin the successive approximation process. This event is shown occurring two clock periods after the lock detector output signal goes high in the example of FIG. 6.

Once the lock detector 60 provides an output signal indicating that the data signal to the successive approximation register is valid and the frequency detector output signal 28 changes state to indicate that a change in the sense of the frequency error has been detected, the microprocessor switches into the successive approximation mode of operation to bring the digital number, and hence the coarse tuning signal, to the proper value in a relatively rapid manner, as explained previously.

In the example of FIG. 6, the microprocessor controlled coarse tuning circuit is able to sweep the coarse tuning signal through the tuning range of the voltage controlled oscillator and bring it to the proper value of 6.7 volts in only twelve clock periods, the required time may be decreased since larger incremental steps can be used during the sweeping operation. For example, a five bit digital number would allow voltage increments of 1.6 volts to be used rather than steps of 0.8 volt, thus decreasing the sweep time from seven to four clock periods, while increasing the successive approximation time by only one clock period.

In contrast to this, a pretuning method using a staircase coarse tuning signal having the same resolution of 0.1 volts would require 67 clock periods to perform the same function. Therefore, it can be seen that the coarse tuning circuit of the present invention, particularly in the embodiment which is microprocessor controlled, provides a substantial savings in time during the pretuning operation.

In addition to the previously described functions, the microprocessor can be programmed to provide additional functions in the pretuning process. For example, if the synthesizer is required to cover a band of frequencies which is narrower than the capture range of the loop without pretuning at each frequency change, it is desirable to perform the initial pretuning step at the center of the frequency band. The pretuning voltage level corresponding to the frequency at the center of the band can be stored in the microprocessor memory, and the microprocessor can be programmed to adjust the pretuning voltage according to a nominal deviation from the stored value. Other desirable functions can also be programmed into the microprocessor.

SUMMARY OF THE ADVANTAGES AND SCOPE OF THE PRESENT INVENTION

From the foregoing, it will be apparent that the present invention provides a novel method and apparatus for automatically and adaptively pretuning a voltage controlled oscillator in a phase-locked loop frequency synthesizer. The automatic pretuning of the oscillator allows the synthesizer to adapt to changing conditions brought about by such factors as misalignment of the oscillator, aging of circuit components, oscillator drift and temperature effects which can lead to lockup failure if the pretuning voltage is fixed as a function of the desired output frequency. In addition to providing adaptability to changing conditions, the use of the successive approximation technique enables the proper pretuning voltage to be generated in a considerably shorter time period than that encountered with the use of a staircase pretuning voltage signal.

Furthermore, when a microprocessor is used to provide the function of the control logic in a successive approximation register, additional versatility can be programmed into the coarse tuning circuit. For example, the microprocessor enables a reverse approximation technique to be used when the pretuning voltage is to be set to a previously known value. The microprocessor enables sweeping of the tuning voltage in those situations in which the pretuning process cannot cover the entire tuning range of the voltage controlled oscillator. Additional desirable functions can be provided by the microprocessor as well.

The present invention may be embodied in other specific forms without departing from the spirit or essential characteristics thereof. The presently disclosed embodiments are therefore considered in all respects as illustrative and not restrictive. The scope of the invention is indicated by the appended claims rather than the foregoing description, and all changes which come within the meaning and range of equivalency of the claims are therefore intended to embraced therein.

What is claimed is:

1. A phase-locked loop frequency synthesizer capable of being automatically adaptively pretuned to avoid lockup failure difficulties associated with the characteristics of synthesizer components, comprising:
   a voltage controlled oscillator having a control input terminal, said oscillator generating an output signal having a frequency related to the voltage of a signal present at said input terminal;
   a source of a reference signal;
   means for comparing the phase difference between said oscillator output signal and said reference signal and for generating a fine tune control voltage which is applied to said control input terminal, said fine tune control voltage having a value such that said oscillator output signal is in phase with said reference signal;
   means for detecting a difference in frequency between said oscillator output signal and said reference signal and for producing an output signal related to the detected frequency difference;
   a storage register for storing a digital number;
   control means responsive to the output signal from said frequency detecting means for adjusting the value of the digital number stored in said register by successively decreasing powers of 2 starting from the power of the most significant bit position; and
   means for converting the digital number stored in said register to a coarse tune control voltage and for applying the coarse tune control voltage to said control input terminal of said voltage controlled oscillator.

2. The frequency synthesizer of claim 1 wherein said storage register and said control means are included in a successive approximation register.

3. The frequency synthesizer of claim 1 further including means for holding said fine tune control voltage at a nominal value while said control means adjusts the value of the digital number stored in said register.

4. The frequency synthesizer of claim 1 further including means for comparing the fine tune control voltage with a threshold value and means for initiating operation of said control means when the fine tune control voltage exceeds the threshold value.

5. The frequency synthesizer of claim 1 wherein said control means comprises a programmable microprocessor.

6. A method of tuning a voltage controlled oscillator in a phase locked loop frequency synthesizer wherein the output signal from the oscillator is automatically brought within the capture range of the phase locked loop to avoid lockup failure difficulties associated with the characteristics of the synthesizer components, comprising the steps of:
   storing a digital number in a storage register;
   converting the number stored in the storage register to a coarse tune control signal;
   applying the coarse tune control signal as an input signal to the voltage controlled oscillator;
   providing a reference signal;
   detecting the difference in frequency between the reference signal and the output signal from the voltage controlled oscillator;
   adjusting the value of the number stored in the storage register by successively decreasing powers of 2 starting from the power of the most significant bit position in dependence upon the sense of the detected difference in frequency between the reference signal and the oscillator output signal; and
   generating a fine tune control signal by means of a phase locked loop and applying said signal to the voltage controlled oscillator to bring the output signal of the voltage controlled oscillator in phase with the reference signal.

7. The tuning method of claim 6 further including the steps of generating a constant fine tune control signal and applying said constant signal to the voltage controlled oscillator during the step of adjusting the value of the digital number stored in the storage register.

8. The tuning method of claim 6 further including the steps of comparing the fine tune control signal with a threshold value and initiating said adjusting step when the fine tune control signal exceeds the threshold value.

9. Apparatus for pretuning a voltage controlled oscillator, comprising:
   a source of a reference signal;
   means for detecting the difference in frequency between the reference signal and an output signal from the voltage controlled oscillator;
   means for generating a digital number and for adjusting said digital number by successively decreasing powers of 2 starting from the power of the most significant bit position in response to the difference in frequency between the reference signal and the oscillator output signal; and
   means for applying the adjusted digital number as a control input signal to the voltage controlled oscillator.

10. The apparatus of claim 9 wherein said means for detecting frequency difference includes a frequency detector which produces a binary output signal having a level dependent upon whether the frequency of the reference signal or the oscillator output signal is greater.

11. The apparatus of claim 10 wherein said generating and adjusting means includes a digital register and control logic for adjusting the value of each bit stored in the register in dependence upon the level of the binary output signal from said frequency detector.

12. The apparatus of claim 9 wherein said means for applying includes a digital-to-analog converter.

13. A method of pretuning a voltage controlled oscillator, comprising the steps of:
   generating a digital number;
   applying the digital number as a control input signal to the voltage controlled oscillator;
   providing a reference signal;
   detecting the difference in frequency between the reference signal and the output signal from the voltage controlled oscillator; and
   adjusting the digital number by successively decreasing powers of 2 starting from the power of the most significant bit position in response to the difference in frequency between the reference and oscillator output signals.

14. A method of pretuning the voltage controlled oscillator in a frequency synthesizer to shift the output signal of the oscillator from a first frequency to a second frequency, comprising the steps of:
   providing a reference signal;
   dividing the output signal of the voltage controlled oscillator by a first divisor factor related to the ratio of the frequency of the reference signal and the first frequency, to produce a divided signal;
   detecting the difference in frequency between the reference signal and the divided signal;
   generating a digital number related to the detected difference in frequency between the reference signal and the divided signal;
   applying the digital number to the voltage controlled oscillator as a course tuning signal;
   changing the divisor factor to a second number related to the ratio of the frequency of the reference signal and the second frequency;
   algebraically adding successively larger bit weightings to the digital number, in dependence upon the sense of the detected frequency difference between the reference and divided signals, until the sense of the detected difference changes, said algebraic adding beginning with the least significant bit; and
   adjusting the digital number resulting from the last algebraically added bit weight in dependence upon the sense of the detected frequency difference between the reference and divided signals.

15. A method of pretuning a voltage controlled oscillator in a phase locked loop frequency synthesizer wherein the tuning range of the voltage controlled oscillator is larger than the capture range of the phase locked loop, comprising the steps of:
   providing a reference signal;
   setting a tuning signal for the voltage controlled oscillator at one end of the tuning range of the voltage controlled oscillator;
   sweeping the tuning signal through the tuning range of the voltage controlled oscillator;
   detecting when the output signal from the voltage controlled oscillator comes within the capture range of the phase locked loop;
   discontinuing said sweeping step;
   detecting the difference in frequency between the reference signal and the output signal from the voltage controlled oscillator;
   generating a digital number;
   applying the digital number as a coarse tuning control signal for the voltage controlled oscillator; and
   adjusting the digital number by successively decreasing powers of 2 starting from the power of the most significant bit position in dependence upon the sense of the detected difference in frequency between the reference and oscillator output signals.

16. The method of claim 15 wherein said step of sweeping the tuning signal includes stepping the tuning signal in incremental steps corresponding to the weight of the bit in said digital number selected as a function of its significance.

17. The method of claim 15 further including the step of continuing to sweep the tuning signal for the voltage controlled oscillator after detecting that the output signal from the voltage controlled oscillator lies within the capture range of the phase-locked loop until the sense of the detected frequency difference between the reference and oscillator output signals changes.

* * * * *